US006110579A

United States Patent [19]

Ikeda et al.

[11] Patent Number: 6,110,579

[45] Date of Patent: Aug. 29, 2000

[54] RECORDING MEDIUM USED IN INFORMATION PROCESSING APPARATUS USING PROBE

[75] Inventors: Tsutomu Ikeda, Hachioji; Takehiko Kawasaki, Atsugi, both of Japan

[73] Assignee: Canon Kabushiki Kaisha, Tokyo, Japan

[21] Appl. No.: 08/990,760

[22] Filed: Dec. 15, 1997

[30] Foreign Application Priority Data

Dec. 17, 1996 [JP] Japan .................................... 8-353558

[51] Int. Cl.[7] ........................................................ B32B 5/16

[52] U.S. Cl. ............................................ 428/323; 428/195

[58] Field of Search .................................... 365/107, 151; 369/126, 282; 428/64.2, 65.3, 141, 145, 332, 323

[56] References Cited

U.S. PATENT DOCUMENTS 5,199,021 3/1993 Hatanaka et al. ....................... 369/126

5,320,703 6/1994 Ikeda et al. ............................... 117/68

FOREIGN PATENT DOCUMENTS 0526237 2/1993 European Pat. Off. ........ G11C 13/02

63-161552 7/1988 Japan .

63-161553 7/1988 Japan .

4241240 8/1992 Japan .

5-109130 4/1993 Japan .

5201793 8/1993 Japan .

*Primary Examiner*—Bruce H. Hess

*Assistant Examiner*—Michael E. Grendzynski

*Attorney, Agent, or Firm*—Fitzpatrick, Cella, Harper & Scinto

[57] ABSTRACT

A recording medium for use in an information processing apparatus applying the STM technique, the recording medium is designed to have a surface which is made of a crystal having a spiral structure. The spiral structure is constituted by a step difference of a size not more than a diameter of an atom constituting the crystal.

5 Claims, 1 Drawing Sheet

1

RECORDING MEDIUM USED IN INFORMATION PROCESSING APPARATUS USING PROBE

BACKGROUND OF THE INVENTION

1. Field of the Invention

The present invention relates to a recording medium used in an information processing apparatus applying the STM technique.

2. Related Background Art

In recent years, a scanning tunneling microscope (STM) that allows the observer to directly observe the electron structure of the surface atom of a conductor was developed (G. Binnig et al., Phys. Rev. Let., 49, 57 (1983)) to enable measurement of a real space image with a high resolution regardless of whether the sample is monocrystalline or amorphous.

This STM exploits the fact that, if a voltage is applied across a metal tip and a conductive material, and the distance between the two is decreased to about 1 nm, a tunneling current flows between them.

This current is very sensitive to changes in distance between the tip and the conductive material, and it changes exponentially. By scanning the tip to keep the tunneling current constant, a surface structure in real space can be observed at a resolution in the atomic order.

The above-mentioned apparatus or means detects a weak current,. so that the surface structure can be advantageously observed with a small power without damaging the medium.

Since the above apparatus can operate in the atmosphere, observation evaluation using the STM technique is widely performed for biological samples, organic molecules, and the like in the atomic or molecular order. Recently, also in the field of industries, given the fact that the STM has spatial resolution in the atomic or molecular size, its application to a recording/reproducing apparatus and its practical use are prevalent (Japanese Laid-Open Patent Application Nos. 63-161552 and 63-161553).

In information processing by this apparatus, information is recorded on the surface of a sample medium by any electrical method while sweeping the tip parallel to the sample surface, and the recorded information is reproduced by measuring a physical phenomenon (e.g., a tunneling current) caused upon approach of the tip to the sample.

In this case, to smoothly record/reproduce information, information must be recorded on the sample with certain regularity. For this purpose, e.g., tracking information (e.g., microstructures) is required on the sample.

However, the recording surface of the sample medium usable for recording/reproducing information in the atomic or molecular size must be flat at the atomic or molecular level. The tracking information must be formed with an atomic- or molecular-level precision without degrading the surface flatness.

As a method capable of tracking at the atomic or molecular level, a method of recording/reproducing information along the regular orientation direction of crystal lattices of a sample medium is proposed (Japanese Laid-Open Patent Application No. 4-241240).

In this method, however, each atom in the crystal face must be recognized, which requires a high detection precision. As a result, the scanning speed decreases. Further, this method cannot be used for a sample medium not having any regular crystal lattice.

SUMMARY OF THE INVENTION

The present invention has been made to solve the conventional problems, and has as its object to provide a recording medium which can be used for recording/reproducing information in the atomic size, and can be scanned at a high speed while keeping the S/N ratio high.

To solve the above problems, according to the present invention, the recording medium for the information processing apparatus applying the principle of the scanning tunnel microscope is constituted by a recording medium made up of a crystal having a spiral structure on its surface.

According to the present invention, the recording medium for the information processing apparatus applying the principle of the scanning tunnel microscope is constituted by a recording medium in which a recording layer is formed on a crystal having a spiral structure on its surface.

DESCRIPTION OF THE PREFERRED EMBODIMENTS

An embodiment of the present invention will be described in detail below with reference to the accompanying drawings.

A recording medium according to the present invention has a spiral structure on its surface, i.e., its recording surface.

Figure 1:
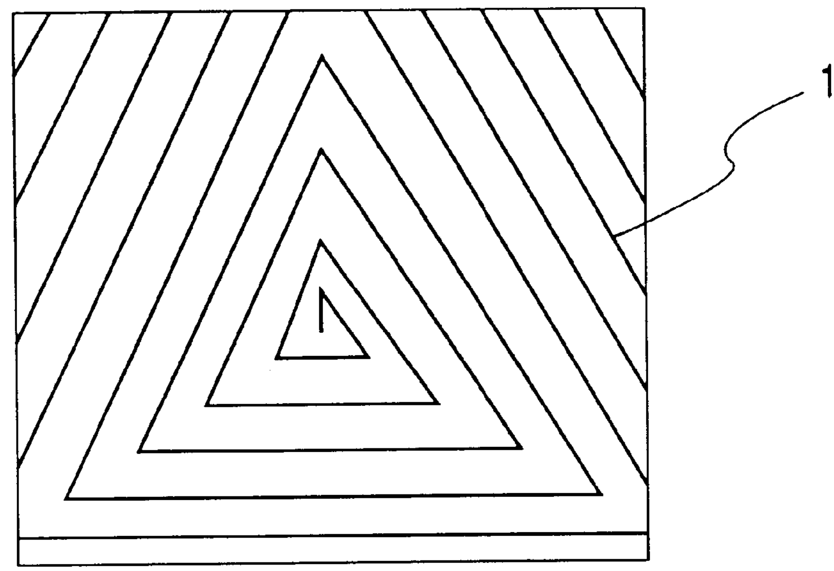
FIG. 1 is a schematic view showing the surface structure of a recording medium according to the present invention.

FIG. 1 is a schematic view showing the spiral structure.

The spiral structure 1 is formed by a plurality of step differences, and the height of each step difference is almost constant. This height is equal to or smaller than the diameter of an atom constituting a crystal (to be described later).

The pitch between the step differences is also almost constant. The spiral structure 1 is traced back to the structure of a crystal constituting the recording medium, and characteristically appears from a scratch or defect as a start point in the crystal upon crystal growth or crystal etching.

The spiral shape changes depending on the type of crystal; it is a circle, a polygon, and the like. The pitch of the spiral can be changed by the growth or etching conditions.

One spiral cannot be formed over a plurality of crystals, but a plurality of spirals can be formed on one single crystal.

The crystal material used as a crystal medium is a material which can form a spiral structure and a flat recording surface at the atomic or molecular level, e.g., a flat Au single crystal obtained from an aqueous solution (Japanese Laid-Open Patent Application No. 5-201793).

A crystal having a spiral structure made up of successive step differences with an atomically flat surface and atomically constant height and pitch is optimum as a recording medium for the following information processing apparatus.

An information processing apparatus applying the STM principle, e.g., an apparatus disclosed in Japanese Laid-Open Patent Application No. 5-109130 can be used to scan the spiral structure on the crystal surface while performing tracking. At this time, if a physical means such as application of a voltage is performed for the crystal, information, in this case microstructures, can be recorded on the crystal surface. By the same scanning, this information can be reproduced.

Figure 2:
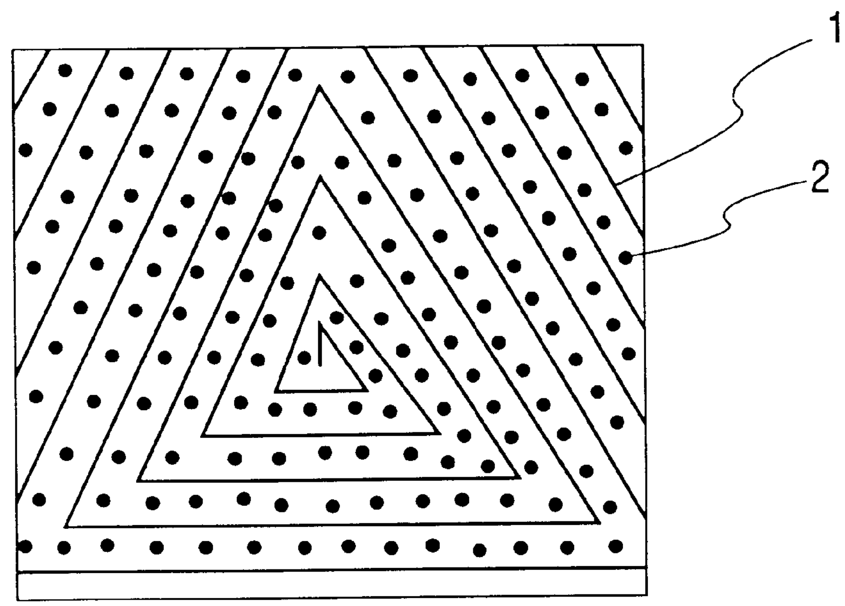
FIG. 2 is a schematic view showing a state wherein information is recorded on the recording medium in FIG. 1.

FIG. 2 is a schematic view showing the recording state. The recording medium of the present invention can be scanned with a high S/N ratio at a high speed because the recording surface is atomically flat, and the step difference and pitch of the spiral structure 1 to be tracked are atomically constant.

The crystal can also be used as a substrate by forming a recording layer on the crystal surface. In this case, the recording layer must reflect the step difference at the single atom step of the substrate crystal on the surface of the recording layer. As a method and material for forming this recording layer, a polyimide film or the like formed by the Langmuir-Blodgett method (LB method) that is disclosed in Japanese Laid-Open Patent Application No. 63-161552 is suitably used. On the polyimide film formed by the LB method, information can be recorded by changing conductivity upon application of a voltage. For the same reason described above, this recording layer can be scanned with a high S/N ratio at a high speed.

Examples of the recording medium according to the present invention will be explained below.

EXAMPLE 1

15 mmol of iodine and 150 mmol of potassium iodide were dissolved in 300 ml of pure water. In the obtained solution, 5 mmol of a gold powder were dissolved.

This solution and a substrate were put in a crystal growth vessel, and heated at 90° C. for 48 h. Upon completion of the crystal growth, the substrate was extracted from the vessel, and cleaned and dried.

The obtained crystal had a maximum diameter of 2 mm and a thickness of about 20 pm. This crystal was observed with an STM to confirm a terrace and a single atom step on the surface.

The tip of the STM was vertically pressed into the flat crystal surface to scratch the surface. The press amount was about 5 nm.

A solution for processing this crystal was prepared.

A processing solution was obtained by dissolving potassium iodide and iodine at concentrations of $1\times10^{-3}$ M and $1\times10^{-4}$ M, respectively.

After the crystal scratched by the STM was dipped in this solution for 5 min, it was washed with distilled water and dried.

When the crystal surface was observed with the STM, a spiral structure 1 was formed centered on the portion into which the tip was pressed.

The spiral structure 1 had a triangular shape, and all the step differences of the structure were at a single atom step. The step pitch was 200 nm.

By an STM with a gold tip, information was recorded on the terrace along the spiral structure using this spiral structure as a tracking pattern.

Recording was performed by supplying a pulse to the crystal surface at 4 V for 1 psec. Upon completion of the recording, the information was reproduced by the same tracking at a scanning rate of 5 mm/sec. A bit projection 2 was satisfactorily formed on the crystal surface along the spiral structure.

EXAMPLE 2

A spiral structure was formed on a crystal by the same method as in Example 1.

Six polyamide acid films were stacked on this crystal by the LB method. The films were heated in vacuum at 350° C. for 1 h to be changed into an imide.

As a result, a recording layer made of a 2.4-nm-thick polyimide film with a constant film thickness could be formed on the crystal.

By an STM with a platinum tip, information was recorded on the polyimide recording layer on a terrace along the spiral structure using this spiral structure as a tracking pattern.

Recording was performed by supplying a pulse to the crystal surface at 9 V for 100 μsec. Upon completion of the recording, the information was reproduced by the same tracking at a scanning rate of 5 mm/sec. A bit 2 was satisfactorily formed on the recording layer along the spiral structure.

As has been described above, according to the present invention, a recording medium for an information processing apparatus applying the principle of a scanning tunnel microscope is formed by a crystal having a spiral structure made up of successive step differences with an atomically flat surface and atomically constant height and pitch. In a recording medium used for recording/reproducing information in the atomic size, a recording medium which can be scanned at a high speed while keeping the S/N ratio high can be realized.

What is claimed is:

1. A recording medium for use in an information processing apparatus using a probe, characterized in that said recording medium has a surface made up of a single crystal having a spiral structure or a collection of such single crystals, said spiral structure being constituted by a step difference of a size not more than a diameter of an atom constituting the single crystal.

2. A medium according to claim 1, wherein said single crystal is a gold crystal.

3. A recording medium for use in an information processing apparatus using a probe, comprising:

a substrate made up of a single crystal having a spiral structure or a collection of such single crystals, said spiral structure being constituted by a step difference of a size not more than a diameter of an atom constituting the single crystal; and a recording layer formed on said substrate.

4. A medium according to claim 3, wherein said single crystal is a gold crystal.

5. A medium according to claim 3, wherein said recording layer is made up of an organic material.

* * * * *

UNITED STATES PATENT AND TRADEMARK OFFICE

CERTIFICATE OF CORRECTION

PATENT NO. : 6,110,579

DATED : August 29, 2000

INVENTOR(S) : TSUTOMU IKEDA ET AL.

It is certified that error appears in the above-identified patent and that said Letters Patent is hereby corrected as shown below:

ON THE COVER PAGE AT [56] FOREIGN PATENT DOCUMENTS

"4241240" should read --4-241240--; and
"5201793" should read --5-201793--
Col. 1, line 30, "current,." should read --current,--;

Col. 3, line 32, "20pm." should read --20μm.--;
line 57, "1 psec." should read -- 1 μsec.--.

Signed and Sealed this

First Day of May, 2001

Attest:

Nicholas P. Godici

NICHOLAS P. GODICI

*Attesting Officer* *Acting Director of the United States Patent and Trademark Office*